(12) United States Patent
Sung et al.

(10) Patent No.: US 7,884,540 B2
(45) Date of Patent: Feb. 8, 2011

(54) ORGANIC LIGHT EMITTING DIODE DISPLAY WITH FLEXIBLE CONDUCTIVE FILM

(75) Inventors: Si-Duk Sung, Seoul (KR); Byung-Sik Koh, Gwangmyeong-si (KR)

(73) Assignee: Samsung Electronics Co., Ltd. (KR)

( * ) Notice: Subject to any disclaimer, the term of this patent is extended or adjusted under 35 U.S.C. 154(b) by 490 days.

(21) Appl. No.: 11/761,905

(22) Filed: Jun. 12, 2007

(65) Prior Publication Data

US 2008/0024056 A1 Jan. 31, 2008

(30) Foreign Application Priority Data

Jul. 26, 2006 (KR) ...................... 10-2006-0070182

(51) Int. Cl.
*H01J 1/62* (2006.01)
*H01J 63/04* (2006.01)

(52) U.S. Cl. .................. 313/504; 313/512; 313/503

(58) Field of Classification Search ................ 313/503, 313/504, 512, 498, 511, 506, 505, 507, 508, 313/509, 510; 315/169.3, 169.4; 345/80, 345/45; 349/149, 150, 151, 152
See application file for complete search history.

(56) References Cited

U.S. PATENT DOCUMENTS

| | | | | |
|---|---|---|---|---|
| 4,138,620 A | * | 2/1979 | Dickson | 313/1 |
| 5,461,202 A | * | 10/1995 | Sera et al. | 174/254 |
| 6,424,092 B1 | * | 7/2002 | Odake et al. | 315/169.3 |
| 6,897,855 B1 | * | 5/2005 | Matthies et al. | 345/204 |
| 6,951,465 B2 | * | 10/2005 | Sweetland et al. | 439/67 |
| 2002/0071066 A1 | * | 6/2002 | Silverbrook | 349/58 |
| 2004/0257515 A1 | * | 12/2004 | Lee | 349/150 |
| 2005/0092993 A1 | * | 5/2005 | Aruga | 257/72 |
| 2005/0205877 A1 | * | 9/2005 | Takahashi et al. | 257/79 |
| 2005/0241853 A1 | * | 11/2005 | Aoki | 174/261 |
| 2005/0280618 A1 | * | 12/2005 | Sato et al. | 345/82 |
| 2006/0001792 A1 | * | 1/2006 | Choi | 349/54 |
| 2006/0017382 A1 | * | 1/2006 | Hu et al. | 313/512 |
| 2006/0192496 A1 | * | 8/2006 | Yamada | 315/169.3 |

(Continued)

FOREIGN PATENT DOCUMENTS

JP 2003-114413 4/2003

(Continued)

*Primary Examiner*—Nimeshkumar D Patel
*Assistant Examiner*—Glenn Zimmerman
(74) *Attorney, Agent, or Firm*—Cantor Colburn LLP (57) ABSTRACT

An organic light emitting diode display includes a display panel having a display area with a plurality of thin film transistors and a peripheral area provided along a circumference of the display area, an emission layer formed within the display area, a driver formed in the peripheral area which applies display signals including gate signals and data signals to the thin film transistors, a driving voltage pad formed in the peripheral area which applies a driving voltage to the display area, a common voltage pad formed in the peripheral area which applies a common voltage to the display area, a main connector connected to an external voltage source, and a flexible conductive film including a conductive layer electrically connecting between at least one of the driving voltage pad and the common voltage pad and the main connector. The organic light emitting diode display facilitates modulation due to a simple structure, and improves a voltage drop phenomenon.

17 Claims, 9 Drawing Sheets

U.S. PATENT DOCUMENTS

| | | | |
|---|---|---|---|
| 2007/0004250 A1* | 1/2007 | Matsuzaki et al. | 439/79 |
| 2008/0007159 A1* | 1/2008 | Seo et al. | 313/504 |
| 2008/0012485 A1* | 1/2008 | Nam | 313/512 |
| 2008/0042549 A1* | 2/2008 | Song et al. | 313/498 |

FOREIGN PATENT DOCUMENTS

| | | |
|---|---|---|
| KR | 1020010021267 | 3/2001 |
| KR | 1020030015062 | 2/2003 |

* cited by examiner

ORGANIC LIGHT EMITTING DIODE DISPLAY WITH FLEXIBLE CONDUCTIVE FILM

This application claims priority to Korean Patent Application No. 10-2006-0070182, filed on Jul. 26, 2006, and all the benefits accruing therefrom under 35 U.S.C. § 119, the contents of which in its entirety are herein incorporated by reference.

BACKGROUND OF THE INVENTION (a) Field of the Invention

The present invention relates to an organic light emitting diode ("OLED") display.

(b) Description of the Related Art

Among flat panel displays, organic light emitting diode ("OLED") displays have drawn attention in recent years owing to its advantages over other flat panel displays. Advantages of OLED displays include low voltage driving, being thin and lightweight, wide viewing angle, fast response speed, and so on.

The OLED display includes a display panel for forming an image and a driver for driving the display panel.

As switching thin film transistor formed at intersections of gate lines and data lines and a driving thin film transistor connected to a driving voltage line for applying a driving voltage are formed on an insulating substrate of the display panel, to form one pixel. Voltage supply pads for supplying a common voltage corresponding to a reference voltage applied to a common electrode and a driving voltage applied to the driving voltage line, respectively, are formed on the periphery of the insulating substrate.

As OLED displays become larger and the number of pixels is increased for higher resolution, a sufficient level of the common voltage and driving voltage must be supplied. At present, for a stabilized power supply and improvement in the uniformity of the entire substrate, the common voltage and driving voltage are supplied from the periphery of the display panel using a printed circuit board ("PCB") and a flexible printed circuit ("FPC"), which are provided separately from the driver.

In the case where a plurality of PCBs are used, there is a problem in that it is not easy to modulate an organic light emitting diode display due to an increase in manufacturing costs and complexity of the PCB structure. There is another problem in the case where a plurality of PCBs are used, in that since a voltage drop phenomenon increases due to an increase in resistance, a voltage to be applied to a driving voltage line or a common electrode must be increased.

BRIEF SUMMARY OF THE INVENTION

Accordingly, the present invention has been made in an effort to provide an organic light emitting diode display, which makes modulation easier owing to a simple structure, and is improved with respect to a voltage drop phenomenon.

According to one exemplary embodiment of the present invention, there is provided an organic light emitting diode display, which includes: a display panel having a display area with a plurality of thin film transistors and a peripheral area provided along a circumference of the display area; an emission layer formed within the display area; a driver formed in the peripheral area, the driver applies display signals including gate signals and data signals to the thin film transistors; a driving voltage pad formed in the peripheral area, the driving voltage pad applies a driving voltage to the display area; a common voltage pad formed in the peripheral area, the common voltage pad applies a common voltage to the display area; a main connector connected to an external voltage source; and a flexible conductive film including a conductive layer electrically connecting between at least one of the driving voltage pad and the common voltage pad, and the main connector.

The conductive layer may include a first conductive layer connecting between the driving voltage pad and the main connector and a second conductive layer connecting between the common voltage pad and the main connector.

The display panel may further include a panel cover protecting and supporting the display panel, and the main connector may be attached to the display panel cover.

The flexible conductive film may further include an insulating layer covering both surfaces of the conductive layer.

The flexible conductive film may expose the conductive layer at both ends.

One end of one surface of the conductive layer and the other end of the other surface thereof may be exposed.

The conductive layer may have a rectangular shape.

The conductive layer may contain conductive metals.

The conductive metals may include at least one selected from the group consisting of aluminum, silver and copper.

The main connector may be detachably coupled to the flexible conductive film.

The main connector may include a bottom portion with a connector conductive layer electrically connected to the conductive layer, a body portion formed on the bottom portion and a rotary cover rotatably coupled to the body portion.

The connector conductive layer may include plate-shaped conductive metals.

The conductive metals may include at least one selected from the group consisting of aluminum, silver and copper.

The conductive layer may include a first conductive layer connecting between the driving voltage pad and the main connector and a second conductive layer connecting between the common voltage pad and the main connector. The connector conductive layer may include a first connector conductive layer connected to the first conductive layer, and a second connector conductive layer connected to the second conductive layer.

The organic light emitting diode display may further include a cable connector detachably coupled to the main connector.

The organic light emitting diode display may further include an anisotropic conductive film formed between the voltage pad and the flexible conductive film.

The organic light emitting diode display may further include a sealing substrate covering the display area between the display panel and the panel cover.

Light emitted from the emission layer may exit to one surface of the display panel where the panel cover is not formed.

BRIEF DESCRIPTION OF THE DRAWINGS

Features, aspects and advantages of the present invention will be made apparent by describing exemplary embodiments of the present invention with reference to the accompanying drawings, in which.

DETAILED DESCRIPTION OF THE INVENTION

The present invention will be described more fully hereinafter with reference to the accompanying drawings, in which exemplary embodiments of the present invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

First, an organic light emitting diode display according to one exemplary embodiment of the present invention will be described in more detail with reference to FIGS. 1 to 7.

Figure 1:
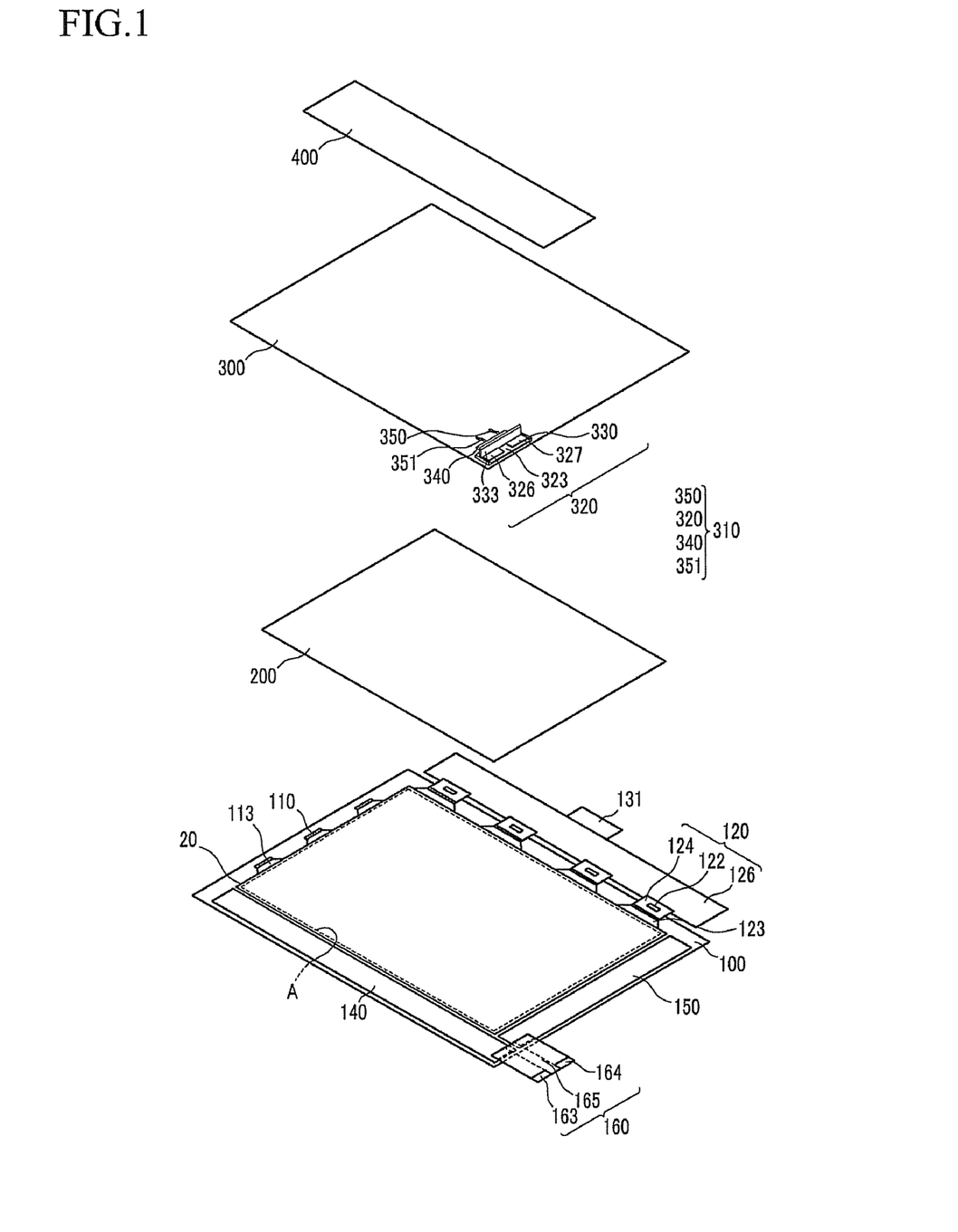
FIG. 1 is an exploded perspective view of an organic light emitting diode display according to one exemplary embodiment of the present invention.
Figure 2:
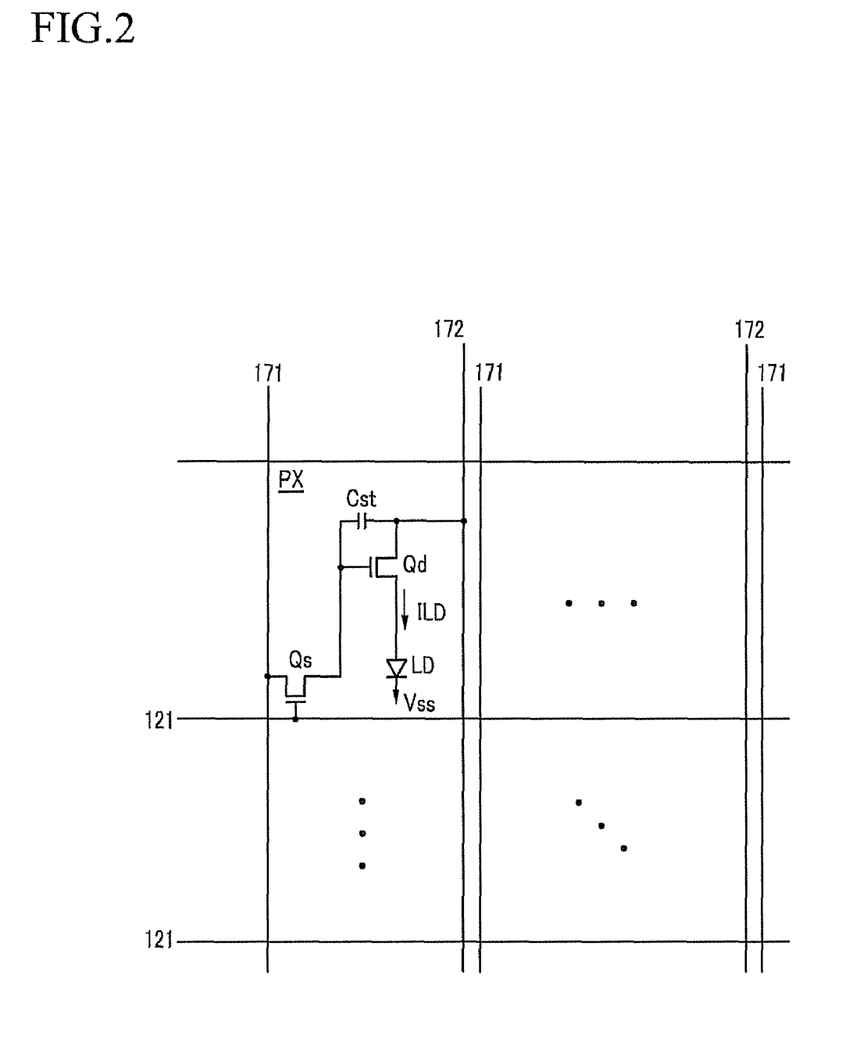
FIG. 2 is an equivalent circuit diagram of an organic light emitting diode display according to one exemplary embodiment of the present invention.
Figure 3:
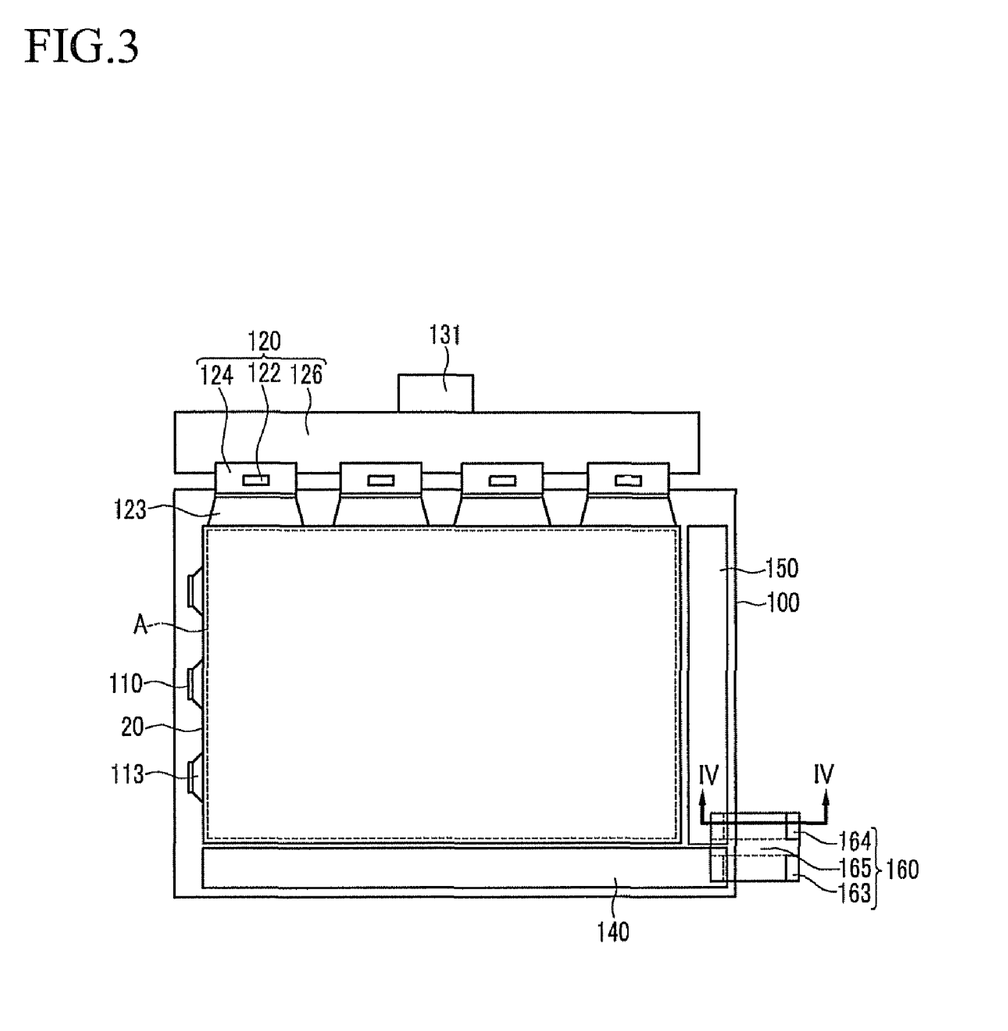
FIG. 3 is a plan view of an exemplary part of an organic light emitting diode display according to one exemplary embodiment of the present invention.
Figure 4:
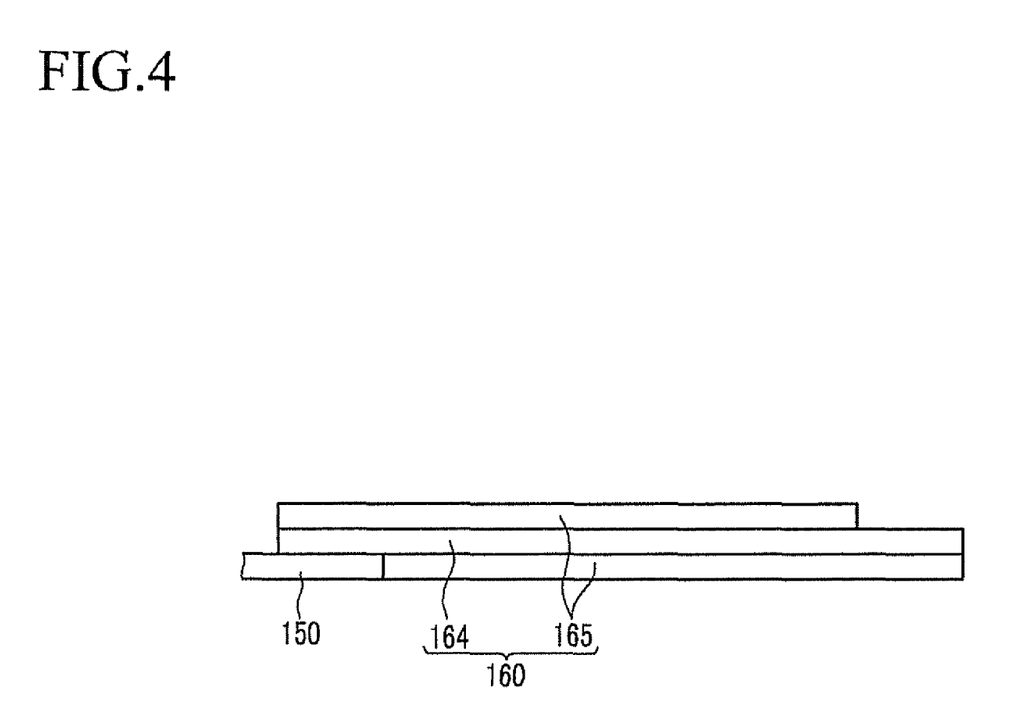
FIG. 4 is a cross-sectional view taken along line IV-IV of the organic light emitting diode display of FIG. 3.
Figure 5:
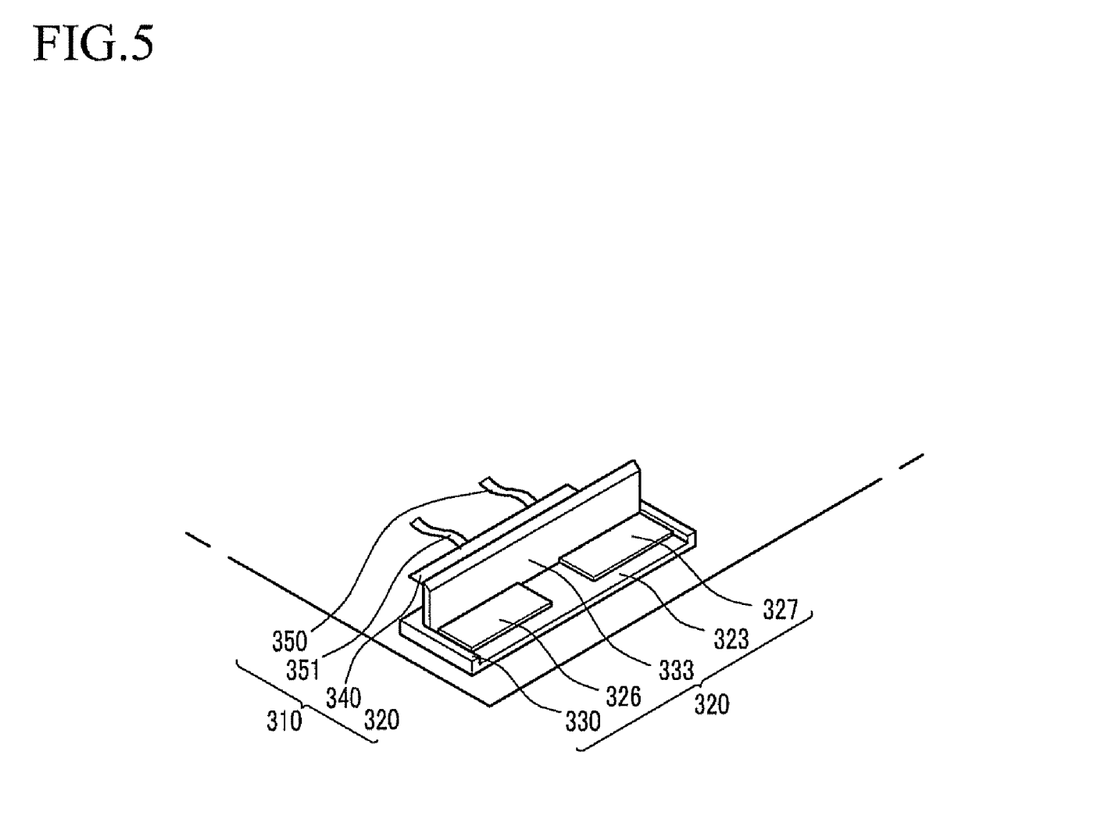
FIG. 5 is an enlarged perspective view of an exemplary part of the organic light emitting diode display of FIG. 1.
Figure 6:
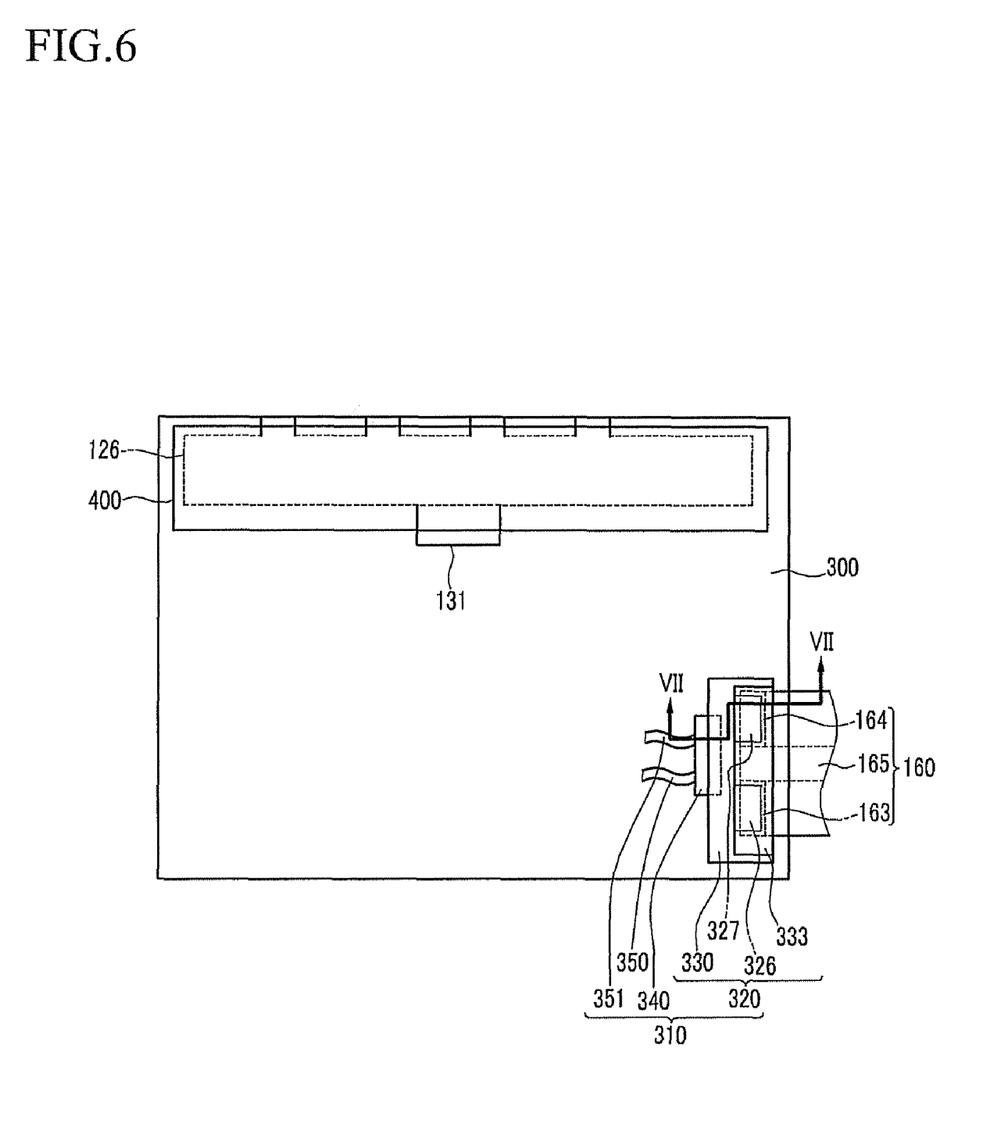
FIG. 6 is a plan view of an organic light emitting diode display according to one exemplary embodiment of the present invention.
Figure 7:
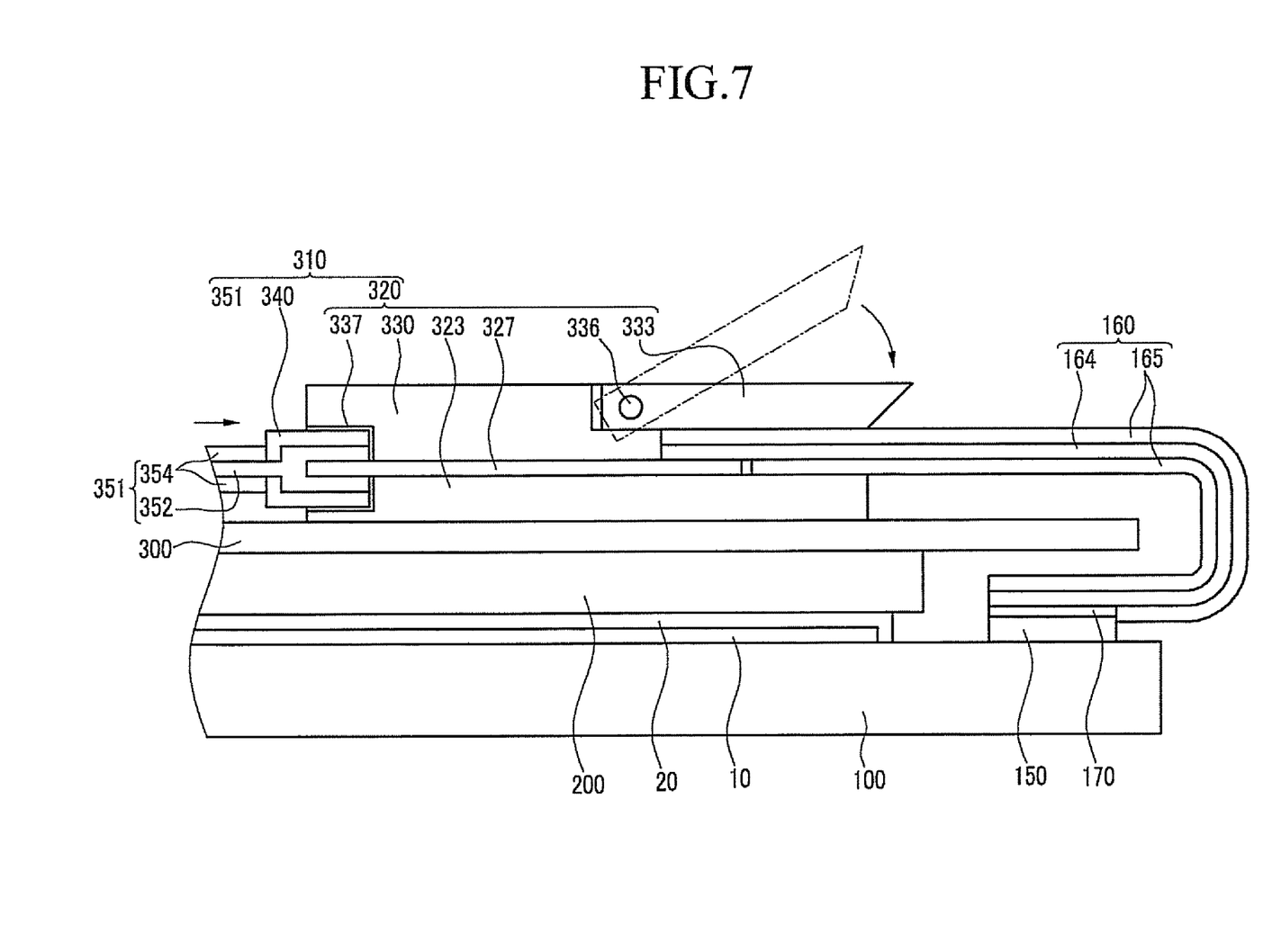
FIG. 7 is a cross-sectional view taken along line VII-VII of the organic light emitting diode display of FIG. 6.

FIG. 1 is an exploded perspective view of an organic light emitting diode display according to one exemplary embodiment of the present invention. FIG. 2 is an equivalent circuit diagram of an organic light emitting diode display according to one-exemplary embodiment of the present invention. FIG. 3 is a plan view of an exemplary part of an organic light emitting diode display according to one exemplary embodiment of the present invention. FIG. 4 is a cross-sectional view taken along line IV-IV of the organic light emitting diode display of FIG. 3. FIG. 5 is an enlarged perspective view of an exemplary part of the organic light emitting diode display of FIG. 1. FIG. 6 is a plan view of an organic light emitting diode display according to one exemplary embodiment of the present invention. FIG. 7 is a cross-sectional view taken along line VII-VII of the organic light emitting diode display of FIG. 6.

The organic light emitting diode display according to one exemplary embodiment of the present invention includes a display panel 100, a sealing substrate 200 covering a display area A of the display panel 100, and a panel cover 300 protecting and supporting the display panel 100. The organic light emitting diode display further includes a circuit board cover 400 for protecting a circuit board 126 when the circuit board 126 is disposed on top of the panel cover 300.

The display panel 100 includes the display area A displaying an image and a peripheral area provided on the outer periphery of the display area A.

As shown in FIG. 2, a plurality of signal lines 121, 171 and 172 and a plurality of pixels PX connected thereto and arranged substantially in a matrix are formed in the display area A.

The signal lines include a plurality of gate lines 121 for transmitting gate signals (also referred to as "scanning signals"), a plurality of data lines 171 for transmitting data signals, and a plurality of driving voltage lines 172 for transmitting driving voltages. The gate lines 121 extend substantially in a row direction and are substantially parallel to each other, while the data lines 171 and the driving voltage lines 172 extend substantially in a column direction and are substantially parallel to each other, as illustrated in FIG. 2.

Each pixel PX includes a switching transistor Qs, a driving transistor Qd, a storage capacitor Cst and an organic light emitting diode LD.

The switching transistor Qs has three terminals: a control terminal connected to one of the gate lines 121; an input terminal connected to one of the data lines 171; and an output terminal connected to the driving transistor Qd. In accordance with the gate signal applied to the gate line 121, the switching transistor Qs transmits the data signal, which is applied to the data line 171, to the driving transistor Qd.

The driving transistor Qd has three terminals: a control terminal connected to the output terminal of the switching transistor Qs; an input terminal connected to one of the driving voltage lines 172; and an output terminal connected to the organic light emitting diode LD. The driving transistor Qd outputs an output current ILD with an amplitude that varies in accordance with a voltage applied between the control terminal and the output terminal of the driving transistor Qd.

The capacitor Cst is connected between the control terminal and the input terminal of the driving transistor Qd. The capacitor Cst stores the data signal applied to the control terminal of the driving transistor Qd, as a charge, and holds the stored charge even after the switching transistor Qs is turned off.

The organic light emitting diode LD has an anode connected to the output terminal of the driving transistor Qd and a cathode connected to a common voltage Vss. The organic light emitting diode LD emits light according to the intensity of the output current ILD supplied from the driving transistor Qd, thereby displaying images.

The switching transistor Qs and the driving transistor Qd are n-channel field effect transistors ("FETs"). However, at least one of the switching transistor Qs and the driving transistor Qd may be a p-channel field effect transistor. The connections between the transistors Qs and Qd, the capacitor Cst and the organic light emitting diode LD may be modified.

A driving voltage pad 140 of a rectangular shape is formed on the peripheral area of the display panel 100 and is connected to one end of the driving voltage lines 172. A common voltage pad 150 of a rectangular shape is also formed on the peripheral area of the display panel 100 and is electrically connected to the common electrode 20.

The driving voltage pad 140 is formed along the peripheral area which faces a data driver 122 of a main driver 120 with the display area A interposed therebetween. The driving voltage pad 140 applies a driving voltage to the driving voltage lines 172, the driving voltage being one of reference voltages of a predetermined level applied via the first conductive layer 163 of the flexible conductive film 160 attached to one side.

The common voltage pad 150 is formed along the peripheral area which faces a gate driver 110 with the display area A interposed therebetween. The common voltage pad 150 applies a common voltage to the common electrode, the common voltage being one of reference voltages of a predetermined level applied via the second conductive layer 164 of the flexible conductive film 160 attached to one side. Although FIG. 1 and FIG. 3 illustrate the common electrode 20 and the common voltage pad 150 as if being separated, the common electrode 20 and the common voltage pad 150 may be directly connected, or connected by a bridge electrode made of a material such as indium tin oxide ("ITO"), for example, but is not limited thereto.

Both of the voltage pads 140 and 150 may be made of a wiring material such as the gate metal, may include any metal layer having conductivity as well as a wiring material, and may be made of ITO or indium zinc oxide ("IZO"), for example.

The position of the voltage pads 140 and 150 is not limited to the above-described position illustrated in FIG. 2, but the position thereof can be modified within the peripheral area.

A gate driver 110 is mounted on the peripheral area which faces the peripheral area where the common voltage pad 150 is formed. The main driver 120 for generating driving signals including gate signals and data signals is mounted on the peripheral area which faces the peripheral area where the driving voltage pad 140 is formed.

The gate driver 110 transmits gate signals received from a circuit board 126 of the main driver 120 to the gate lines 121. The gate driver 110 is mounted on the display panel 100 in a chip on glass ("COG") method. In the case where the gate driver 110 is mounted on the display panel 100 in a chip design, gate on/off voltages outputted from the circuit board 126 may be provided to the gate driver 110 via a wiring pattern (not shown) formed on the data driver 122 and the display panel 100. That is, the organic light emitting diode display according to one exemplary embodiment of the present invention does not include any particular circuit board connected to the gate driver 110.

On the other hand, the gate driver 110 may include a shift register connected to the end of each gate line 121, rather than including a chip. The shift register consists of a plurality of transistors formed on the display panel 100, and is directly formed on the display panel 100 when forming a signal line. Even when the gate driver 110 is formed of a shift register, gate on/off voltages and various display signals applied to the gate lines 121 are directly transmitted to the shift register via electrical wiring, and thus no particular circuit board is required.

Alternatively, the gate driver 110 may receive gate on/off voltages and various display signals through a circuit board provided in the vicinity.

The main driver 120 includes the data driver 122, a soft member 124 and the circuit board 126.

The data driver 122 is formed on the soft member 124, and applies data signals received from the circuit board 126 to the data lines 171.

The soft member 124 electrically connects the circuit board 126 and the display panel 100. The soft member 124 may be attached to the display panel 100 and the circuit board 126, respectively, using an anisotropic conductive film (not shown). The soft member 124 may be easily deformed because of its flexibility. Although not shown, wiring for electrically connecting the data driver 122 to the display panel 100 and the circuit board 126 is formed in the soft member 124.

The circuit board 126 is connected to the data driver 122 via the soft member 124, and includes a voltage generator generating various voltages, such as a gate voltage and a data voltage, to be provided to the display area A, and a timing controller outputting various display signals to be provided to the gate driver 110 and the data driver 122.

According to another exemplary embodiment, the circuit board 126 may be provided in a plural number, including one for generating a gray voltage and one for receiving display signals. That is, the circuit board 126 connected to the data driver 122 may be provided in a plural number connected to each other. An external voltage input section 131 for receiving an external voltage and image signals is formed at a predetermined region of the circuit board 126. An external voltage and image signals are input into the circuit board 126 by a signal cable (not shown) connected to the external voltage input section 131.

The circuit board 126 is folded onto the opposite surface of the surface of the display panel 100 emitting light and displaying images after completion of the display panel 100. That is, the circuit board 126 connected to the data driver 122 is bent to the top surface of the display panel 100 emitting light to the back surface of the circuit board 126, and is disposed on top of the panel cover 300 (see FIG. 6).

The gate lines 121 and data lines 171 in the display area A extend to the peripheral area to be connected to the gate driver 110 and the data driver 122, respectively. At the connecting portions, gate fan-out portions 113 are formed where wiring intervals of the extended gate lines 121 become gradually narrower, and data fan-out portions 123 are formed where wiring intervals of the data lines 171 become gradually narrower.

One end of the flexible conductive film 160 is coupled to an end of each of the voltage pads 140 and 150 where they are neighboring each other. The other end of the flexible conductive film 160 is detachably coupled to a main connector 320 of a voltage input section 310 (see FIG. 6).

The flexible conductive film 160 includes a first conductive layer 163 and a second conductive layer 164 which are rectangular-shaped thin films and an insulating layer 165 covering both surfaces of these conductive layers 163 and 164. The first conductive layer 163 and a second conductive layer 164 are arranged to be spaced apart from each other.

The conductive layers 163 and 164 are conductive metals having low resistivity because of their excellent electrical conductivity, and may include at least one selected from the group consisting of aluminum, silver and copper.

By forming a conventional conductive material covered with the insulating layer 165 from the conductive layers 163 and 164 which are rectangular-shaped thin films, instead of from fine wiring, the cross-sectional area increases, thereby reducing electrical resistance. Consequently, a voltage drop phenomenon can be improved.

The insulating layer 165 is made of a flexible insulating resin. The insulating layer 165 electrically separates the first conductive layer 163 and the second conductive layer 164, and keeps the interval between the conductive layers 163 and 164 constant.

One end of one surface of the conductive layers 163 and 164 and the other end of the other surface are exposed to the outside because the insulating layer 165 is removed therefrom (see FIG. 4). Therefore, one end of one surface of the first conductive layer 163 is in contact with one end of the driving voltage pad 140 and is electrically connected thereto. One end of one surface of the second conductive layer 164 is in contact with one end of the common voltage pad 150 and is electrically connected thereto.

On the other hand, the other ends of the other surfaces of the conductive layers 163 and 164 are electrically connected corresponding to connector conductive layers 326 and 327, respectively, of the main connector 320.

A specific connection between the flexible conductive film 160 and the voltage pads 140 and 150 will be described by taking the second conductive layer 164 and the common voltage pad 150 as an example.

As shown in FIG. 7, an anisotropic conductive film 170 is formed on the common voltage pad 150 being in contact with one exposed end of one surface of the second conductive layer 164. The anisotropic conductive film 170 functions to improve electrical contact efficiency between the common voltage pad 150 and the second conductive layer 164 and protects against physical impact. A connection procedure of the common voltage pad 150 and the second conductive layer 164 of the flexible conductive film 160 is carried out by a pressing process in which the anisotropic conductive film 170 and one exposed end of the second conductive layer 164 are arranged on the common voltage pad 150, and a pressure is applied over the one end of the second conductive layer 164.

The sealing substrate 200 is bonded to the top surface of the display panel 100.

The sealing substrate 200 is aligned so as to correspond to the display area A at the top of the display panel 100, and is thereafter bonded to the display panel 100. The sealing substrate 200 prevents moisture or oxygen from permeating into the emission layer 10, thereby preventing deterioration of the emission layer 10. A blocking layer and/or a passivation layer made of organic material and/or inorganic material may be formed between the common electrode 20 formed on the uppermost part of the display panel 100 and the sealing substrate 200. The blocking layer and/or the passivation layer are generally made of such a material which is hardened by heat or light, and which allows the display panel 100 and the sealing substrate 200 to be easily bonded to each other.

The panel cover 300 is formed on the sealing substrate 200.

The panel cover 300 is formed on the sealing substrate 200 after the sealing substrate 200 is bonded to the display panel 100 and the circuit board 126 and the flexible conductive film 160 are connected to each other. The panel cover 300 serves to make transportation of the OLED display easier by packaging the display panel 100, and to protect the display panel 100 by supporting the display panel 100. The panel cover 300 is made of an insulating material for preventing electrical conduction with a plurality of signal wirings and the voltages pads 140 and 150 formed on the display panel 100. The panel cover 300 may include an insulating resin or the like which is lightweight and has good strength.

The panel cover 300 may include an opening at a portion where the circuit board 126 is located. That is, in order to make the organic light emitting diode display thinner, part of the panel cover 300 may be removed from the portion where the circuit board 126 is to be placed. As a resultant, the OLED display becomes more lightweight and the manufacturing costs are reduced.

The voltage input section 310 is formed at the panel cover 300.

The voltage input section 310 inputs a common voltage of a predetermined level and a driving voltage, which are reference voltages generated by an external voltage source (not shown), to the driving voltage pad 140 and the common voltage pad 150, respectively, via the flexible conductive film 160. The voltage input section 310 includes a main connector 320 and a cable connector 340 detachably coupled to the main connector 320.

The other end of the flexible conductive film 160 which is bent to extend on the top surface of the display panel 100 is detachably coupled to the main connector 320.

The main connector 320 includes a bottom portion 323, a body portion 330 and a rotary cover 333.

Connector conductive layers 326 and 327 (only conductive layers 327 shown in FIG. 7) are formed at the bottom portion 323 and provided in a plate shape instead of a fine wiring pattern in order to reduce electrical resistance and electrically separated from each other.

The first connector conductive layer 326 is connected to the first conductive layer 163 to transmit a driving voltage to the driving voltage pad 140. The second connector conductive layer 327 is connected to the second conductive layer 164 to transmit a common voltage to the common voltage pad 150.

Like the conductive layers 163 and 164, the connector conductive layers 326 and 327 are conductive metals having low resistivity because of their excellent electrical conductivity, and may include at least one selected from the group consisting of aluminum, silver and copper.

The body portion 330 extends above the bottom portion 323, along the peripheries of a remaining three sides of the bottom portion 323 except one side thereof.

The rotary cover 333 which is rotatably coupled by a rotation shaft 336 is formed inside the body portion 330.

With the rotary cover 333 being opened, the other ends of the conductive layers 163 and 164 of the conductive film 160 are mechanically and electrically coupled to the corresponding connector conductive layers 326 and 327, respectively. Afterwards, when the rotary cover 333 rotates and enters into a locked state, the rotary cover 333 puts pressure on the flexible conductive film 160, thereby preventing movement and withdrawal of the flexible conductive film 160. In this way, the electrical connection state of the conductive layers 163 and 164 and the connector conductive layers 326 and 327 is continuously ensured.

At the rear side of the main connector 320, there is formed a coupling groove 337 at which some portion of the connector conductive layers 326 and 327 protrude. The cable connector 340 is detachably connected to the main connector 320 through the coupling groove 337.

One end of each of a driving voltage cable 350 and a common voltage cable 351 are connected to the rear side of the cable connector 340.

Each of cables 350 and 351 includes metal wiring 352 and an insulating coating 354 covering the metal wiring 352. The metal wiring 352 of the cables 350 and 351 are coupled to the connector conductive layers 326 and 327, respectively.

Since the other ends of the cables 350 and 351 are connected to an external voltage source (not shown), reference voltages generated from the external voltage source are sequentially applied to the metal wiring 352, the connector conductive layers 326 and 327, the conductive layers 163 and 164, and the voltage pads 140 and 150.

In the organic light emitting diode display according to the present exemplary embodiment, the light from the emission layer 10 exits to the back surface of the display panel 100 where no panel cover 300 is provided. Accordingly, the voltage input section 310 connected to the flexible conductive film 160 and the bent circuit board 126 may be formed on the panel cover 300.

Preferably, the voltage input section 310 is formed at a region adjacent to both the driving voltage pad 140 and the common voltage pad 150. If the voltage input section 310 is located adjacent to the voltage pads 140 and 150, the length of the flexible conductive film 160 connected to the voltage input section 310 and the voltage pads 140 and 150 becomes shorter, thereby reducing resistivity. Accordingly, the transmission of electrical signals becomes quicker, and a voltage drop phenomenon is improved.

As shown in FIG. 6, the circuit board cover 400 protects the circuit board 126 which is located on top of the panel cover 300 and exposed to the outside. The circuit board cover 400 is formed in a thin plate typically made of an insulating resin material, and is secured to the panel cover 30 with screws or with any other known mechanical and or chemical fastener (not shown). Another cover performing the same function as the circuit board cover 400 may be further formed on the voltage input section 310.

Conventionally, the voltage input section 310 for inputting a common voltage and a driving voltage has been mounted on the circuit board 126. The common voltage and driving voltage inputted through the circuit board 126 have been transmitted to the voltage pads 140 and 150, respectively, via a plurality of flexible conductive films and printed circuit boards ("PCBs"). When voltages are transmitted via a plurality of media as above, a voltage drop occurs due to increased resistance, and the lateral sides of the display panel 100 becomes more complex in terms of structure due to the plurality of PCBs.

However, according to one exemplary embodiment of the present invention, the voltage input section 310 having a simple structure for inputting a driving voltage and a common voltage are disposed on the panel cover 300 at the portion adjacent to the voltage pads 140 and 150, thereby achieving a stabilized power supply. Moreover, the lateral sides of the display panel 100 are arranged simply in terms of structure, so that packaging of the display panel 100 becomes easier, the modulation of the organic light emitting diode display is made easier and a voltage drop phenomenon is improved.

Hereinafter, an organic light emitting diode display according to another exemplary embodiment of the present invention will be described with reference to FIGS. 8 and 9, with a focus on the differences from the organic light emitting diode display according to the previous exemplary embodiment of the present invention.

Figure 8:
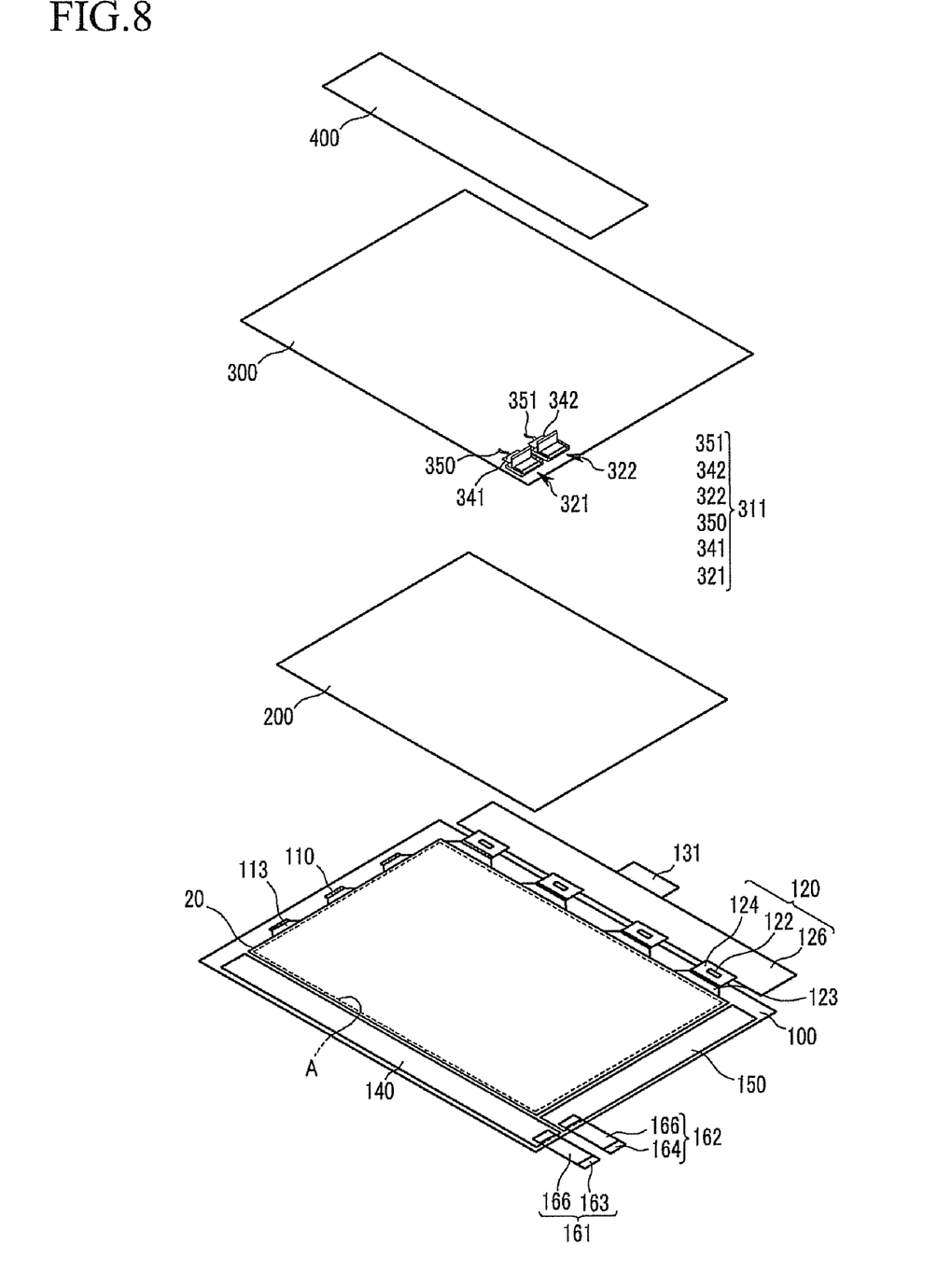
FIG. 8 is an exploded perspective view of an organic light emitting diode display according to an alternative exemplary embodiment of the present invention.
Figure 9:
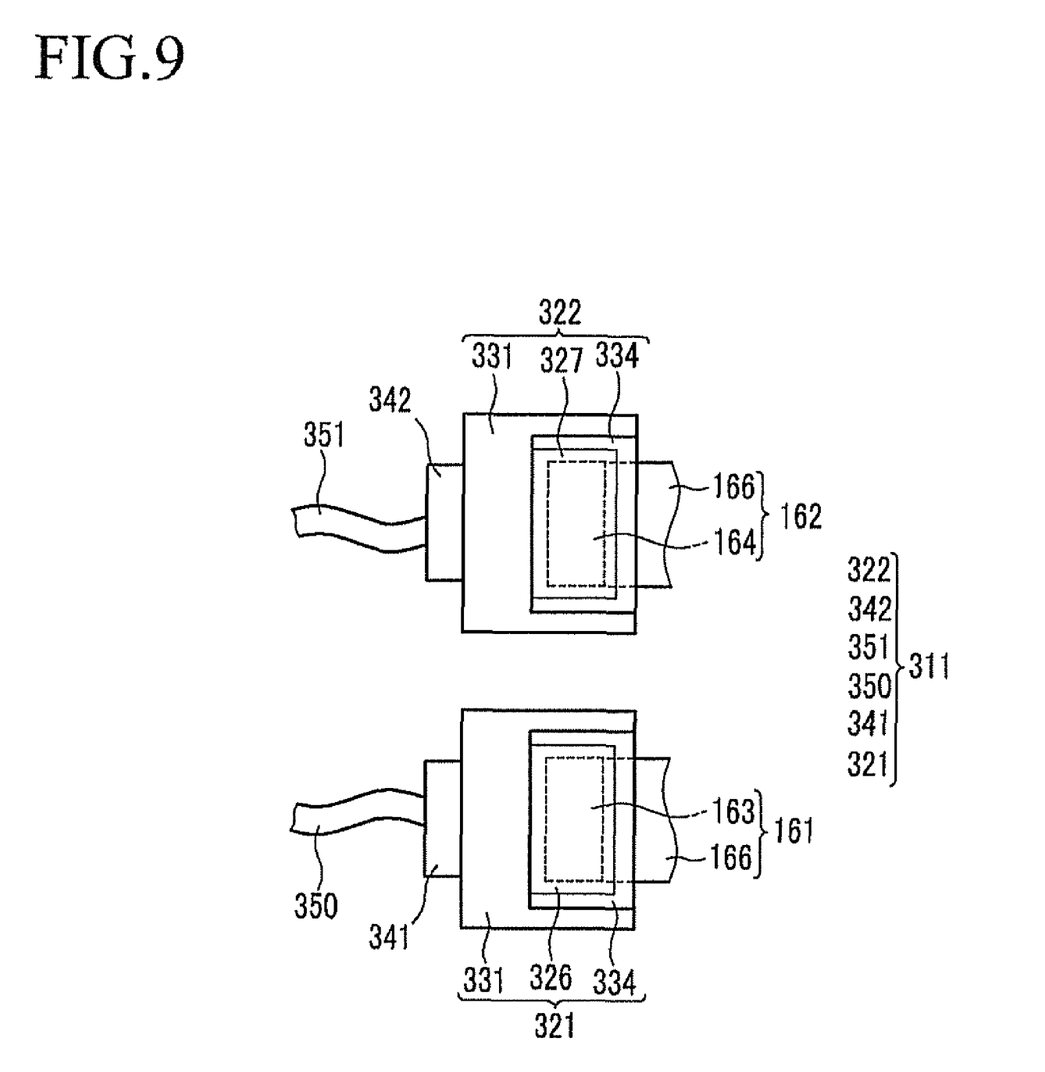
FIG. 9 is an enlarged plan view of an exemplary part of the organic light emitting diode according to the alternative exemplary embodiment of the present invention.

FIG. 8 is an exploded perspective view of an organic light emitting diode display according to another exemplary embodiment of the present invention. FIG. 9 is an enlarged plan view of an exemplary part of the organic light emitting diode according to the present alternative exemplary embodiment.

In the organic light emitting diode display according to this alternative exemplary embodiment of the present invention, each insulating layer 166 covers the first conductive layer 163 and the second conductive layer 164, respectively, unlike the organic light emitting diode display according to the previous exemplary embodiment of the present invention where one insulating layer 165 covers both of the first conductive layer 163 and the second conductive layer 164. That is, not one but two flexible conductive films 161 and 162 are provided. Therefore, it is desirable that two main connectors 321 and 322 and cable connectors 341 and 342 are provided. Accordingly, the sizes of a bottom portion 324, a body portion 331 and a rotary cover 334 of each main connector 321 and 322 are modified according to the flexible conductive films 161 and 162, and the sizes of the cable connectors 341 and 342 are also modified accordingly.

When the flexible conductive films 161 and 162 are completely separated from each other, it is advantageous in that each flexible conductive film 161 and 162 can be attached to positions other than neighboring ends of the driving voltage pad 140 and common voltage pad 150.

The organic light emitting diode display according to this alternative exemplary embodiment of the present invention can achieve the same effects as those of the organic light emitting diode display according to the previous exemplary embodiment of the present invention.

As seen from the above, according to the present invention, there is provided an organic light emitting diode display which makes modulation easier because of a simpler structure, and improves a voltage drop phenomenon.

While this invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. An organic light emitting diode display comprising:
    a display panel having a display area with a plurality of thin film transistors and a peripheral area provided along a circumference of the display area;
    an emission layer formed within the display area;
    a driver formed in the peripheral area, the driver applies display signals including gate signals arid data signals to the plurality of thin film transistors;
    a driving voltage pad formed in the peripheral area, the driving voltage pad applies a driving voltage to the display area;
    a common voltage pad formed in the peripheral area, the common voltage pad applies a common voltage to the display area;
    a printed circuit board connected to the display area, the printed circuit board applies the display signals to the driver;
    a panel cover protecting and supporting the display panel;
    a voltage input section attached to the panel cover and comprising a main connector, the main connector connects to an external voltage source and supplies the driving voltage and the common voltage; and
    a flexible conductive film including a conductive layer electrically connecting between at least one of the driving voltage pad and the common voltage pad, and the main connector,
    wherein the voltage input section is separated from the printed circuit board and is disposed adjacent to the driving voltage pad and the common voltage pad.

2. The organic light emitting diode display of claim 1, wherein the conductive layer comprises a first conductive layer connecting between the driving voltage pad and the main connector and a second conductive layer connecting between the common voltage pad and the main connector.

3. The organic light emitting diode display of claim 1, wherein the flexible conductive film further comprises an insulating layer covering both surfaces of the conductive layer.

4. The organic light emitting diode display of claim 3, wherein the flexible conductive film exposes the conductive layer at both ends.

5. The organic light emitting diode display of claim 4, wherein one end of one surface of the conductive layer and the other end of the other surface thereof are exposed.

6. The organic light emitting diode display of claim 4, wherein the conductive layer has a rectangular shape.

7. The organic light emitting diode display of claim 1, wherein the conductive layer contains conductive metals.

8. The organic light emitting diode display of claim 7, wherein the conductive metals comprise at least one selected from the group consisting of aluminum, silver and copper.

9. The organic light emitting diode display of claim 1, wherein the main connector is detachably coupled to the flexible conductive film.

10. The organic light emitting diode display of claim 9, wherein the main connector comprises:
    a bottom portion with a connector conductive layer electrically connected to the conductive layer;
    a body portion formed on the bottom portion; and
    a rotary cover rotatably coupled to the body portion.

11. The organic light emitting diode display of claim 10, wherein the connector conductive layer comprises plate-shaped conductive metals.

12. The organic light emitting diode display of claim 11, wherein the conductive metals comprise at least one selected from the group consisting of aluminum, silver and copper.

13. The organic light emitting diode display of claim 10, wherein the conductive layer comprises a first conductive layer connecting between the driving voltage pad and the main connector and a second conductive layer connecting between the common voltage pad and the main connector, and
    the connector conductive layer comprises:
    a first connector conductive layer connected to the first conductive layer; and
    a second connector conductive layer connected to the second conductive layer.

14. The organic light emitting diode display of claim 1, further comprising a cable connector detachably coupled to the main connector.

15. The organic light emitting diode display of claim 1, further comprising an anisotropic conductive film formed between the common voltage pad and the flexible conductive film.

16. The organic light emitting diode display of claim 1, further comprising a sealing substrate covering the display area between the display panel and the panel cover.

17. The organic light emitting diode display of claim 1, wherein light emitted from the emission layer exits to one surface of the display panel where the panel cover is not formed.

* * * * *